US010340892B2

(12) United States Patent
Bacon et al.

(10) Patent No.: US 10,340,892 B2
(45) Date of Patent: Jul. 2, 2019

(54) MULTI-CHANNEL DIGITAL STEP ATTENUATOR ARCHITECTURE

(71) Applicant: pSemi Corporation, San Diego, CA (US)

(72) Inventors: Peter Bacon, Derry, NH (US); Vikas Sharma, Reading (GB)

(73) Assignee: pSemi Corporation, San Diego, CA (US)

( * ) Notice: Subject to any disclaimer, the term of this patent is extended or adjusted under 35 U.S.C. 154(b) by 56 days.

(21) Appl. No.: 15/683,667

(22) Filed: Aug. 22, 2017

(65) Prior Publication Data

US 2019/0068167 A1 Feb. 28, 2019

(51) Int. Cl.
*H03L 5/00* (2006.01)
*H03H 11/24* (2006.01)
*H01P 3/00* (2006.01)
*H03H 7/38* (2006.01)

(52) U.S. Cl.
CPC ........... *H03H 11/245* (2013.01); *H01P 3/003* (2013.01); *H03H 7/38* (2013.01); *H03H 11/24* (2013.01)

(58) Field of Classification Search
None
See application file for complete search history.

(56) References Cited

U.S. PATENT DOCUMENTS

| 7,868,681 | B2 * | 1/2011 | van der Wagt | H03G 1/0088 |
| | | | | 327/308 |
| 9,397,635 | B2 | 7/2016 | Costa | |
| 9,531,359 | B1 | 12/2016 | Shrivastava | |
| 2013/0043962 | A1 * | 2/2013 | Granger-Jones | H03M 1/682 |
| | | | | 333/81 R |
| 2014/0002214 | A1 * | 1/2014 | Bawell | H01P 1/22 |
| | | | | 333/81 R |
| 2015/0137913 | A1 * | 5/2015 | Costa | H03H 11/245 |
| | | | | 333/81 R |
| 2015/0326204 | A1 * | 11/2015 | Cho | H03H 11/245 |
| | | | | 327/308 |
| 2015/0326205 | A1 * | 11/2015 | Cho | H03H 11/16 |
| | | | | 333/81 R |
| 2016/0241216 | A1 * | 8/2016 | Bawell | H01P 1/22 |
| 2017/0104471 | A1 * | 4/2017 | Shrivastava | H03K 5/08 |

(Continued)

*Primary Examiner* — Lincoln D Donovan
*Assistant Examiner* — Khareem E Almo
(74) *Attorney, Agent, or Firm* — Jaquez Land Greenhaus LLP; John Land, Esq.

(57) ABSTRACT

A multi-channel digital step attenuator (DSA) architecture. One embodiment includes an array comprising N channels of B selectable attenuator cells series-connected. The overall impedance of a multi-channel DSA is a function of the parallel impedances of the N channels, and transition levels are reduced by 1/N since the transient effect of switching any one attenuator cell in or out of circuit in one channel is mitigated by all other in-circuit attenuator cells in the parallel channels. The multi-channel DSA architecture enables a great design flexibility, and allows a designer to vary one or more of at least the following design parameters: the number of attenuator cells B per channel; the number N of channels per DSA; the bit weighting of each attenuator cell per channel; the maximum attenuation per channel; and the characteristic impedance $Z_{o_n}$ of each channel.

37 Claims, 12 Drawing Sheets

(56) References Cited

U.S. PATENT DOCUMENTS

| | | | |
|---|---|---|---|
| 2017/0237412 A1* | 8/2017 | Sharma | H03H 7/24 |
| | | | 333/81 R |
| 2017/0250723 A1* | 8/2017 | Srirattana | H01P 5/02 |
| 2018/0054178 A1* | 2/2018 | Bergsma | H03H 7/25 |
| 2018/0062622 A1* | 3/2018 | Yan | H03F 1/56 |
| 2018/0102763 A1* | 4/2018 | Lam | H03H 11/245 |
| 2018/0234080 A1* | 8/2018 | Shrivastava | H03H 11/20 |

* cited by examiner

1400

1420

1410

1430

MULTI-CHANNEL DIGITAL STEP ATTENUATOR ARCHITECTURE

BACKGROUND

(1) Technical Field

This invention relates to electronic circuits, and more particularly to electronic digital step attenuator circuits.

(2) Background

An attenuator is an electronic device that reduces the power of a signal, and is frequently used in combination with other electronic circuitry to regulate voltages, provide gain control, adjust power levels, provide compensation for variations in temperature, improve impedance matching, and other functions. For example, in measuring signals, attenuators are used to lower the amplitude of a signal under test a known amount to enable measurements, or to protect the measuring device from signal levels that might damage it. Attenuators may also be used to match different impedances by absorbing the impedance mismatch into the lossy, resistive structure of the attenuator. A minimum loss pad (MLP) is one common example that is often used to match 75 ohm and 50 ohm system impedances.

When used to process radio frequency (RF) signals, ideally an attenuator reduces signal power without appreciably distorting the signal waveform. For RF applications, attenuators typically comprise a small network of passive (and, optionally, active) devices. Classic examples of single-valued RF attenuators are two-port Bridged-Tee, Pi, Tee, or L-pad type attenuators.

Multiple single-valued RF attenuators of various types may be series-connected to provide for a selectable amount of attenuation under digital control. For example, FIG. 1A is a block diagram of a prior art digital step attenuator (DSA) 100, and FIG. 1B is a block diagram of an enlarged attenuator cell 102-$x$ from FIG. 1A. A typical DSA consists of a series cascade of selectable single-valued RF attenuator cells 102-0 to 102-B, where each attenuator cell 102-$x$ is controlled by a corresponding control bit from a control circuit (not shown) in known fashion. DSAs are frequently used with RF systems such as transceivers for broadcast radio, cellular telephones, and RF based digital networks (e.g., WiFi, Bluetooth).

A typical RF attenuator cell 102-$x$ is designed to have two selectable states: (1) an attenuation state providing a specified level of signal attenuation, and (2) a bypass or reference state, providing no significant attenuation. For example, referring to FIG. 1B, the bypass state may be provided by a switch SW connected in parallel with the input and output ports of an attenuator element R (represented as a resistor symbol in FIG. 1B). The switch SW is often a field effect transistor (FET), and is commonly a MOSFET (the ON resistance of a FET is generally negligible in the context of DSAs). For RF applications, the attenuator element R would commonly be an attenuator network, such as the well-known two-port Bridged-Tee, Pi, Tee, or L-pad type attenuator networks.

A typical DSA 100 provides attenuation values that are binary weighted. For example, in FIG. 1B, a B-bit binary code may be applied to control lines (not shown) of the DSA 100 to select any set of the B attenuator stages 102-0 to 102-B to attenuate a signal between the input port RFIN and the output port RFOUT, in equal increments (e.g., 0.25 dB per step). Thus, for example, if B equals 7 bits and the binary least significant bit (LSB) is equal to 0.25 dB, a binary control signal of "0111111" (read MSB to LSB, left to right) will provide an attenuation (negative gain) of '15.75 dB, while a binary control signal of "1000100" will provide an attenuation of −17.0 dB.

A common problem with a binary-weighted DSA 100 is that the component switching elements in the attenuator cells do not turn ON and OFF at the same rate. For FETs used as the switching elements, typically the turn-on time is faster than the turn-off time. This creates a scenario in which various attenuator cells can temporarily present less attenuation as they are changing states. This asymmetrical switching can produce a transient glitch at the DSA output, which can degrade the performance of a feedback communication system in which such a DSA is embedded.

Further, new applications have required ever finer resolutions for DSAs, leading to extreme ratios of most-significant-bit (MSB) attenuation value to least-significant-bit (LSB) attenuation value, which in turn poses significant manufacturability challenges. In addition, such applications have required increasing range to resolution ratios; where in the past, a 32 dB DSA might be configured with a step size of 0.25 dB, requiring 7 bits of control, new applications may require 10 bits or more of control for the same range of attenuation, resulting in a step size specification of 0.03125 dB or smaller, which again poses significant manufacturability challenges. The problem becomes worse for high resolution DSAs having a smaller attenuation range; thus, for example, a 10-bit DSA having a −6 dB total attenuation range requires an LSB attenuation value of 0.00586 dB.

Accordingly, there is a need for an improved DSA architecture that fundamentally improves transient glitch behavior, provides for an MSB to LSB ratio more readily and uniformly achievable with various manufacturing processes, and provides for very fine resolution step sizes more readily and uniformly achievable with various manufacturing processes. The present invention meets these and other needs, as described below.

SUMMARY OF THE INVENTION

The present invention encompasses a multi-channel digital step attenuator (DSA) architecture that fundamentally improves transient glitch behavior, provides for an MSB to LSB ratio more readily and uniformly achievable with various manufacturing processes, and provides for very fine resolution step sizes more readily and uniformly achievable with various manufacturing processes. The present invention further encompasses an improved multi-channel DSA architecture that allows use of a simple attenuator network within each attenuator cell that is compact, simple to implement, and exhibits good return loss behavior.

In one embodiment, a multi-channel DSA in accordance with the present invention includes an array comprising N channels of B selectable RF attenuator cells series-connected between an input port and an output port, where N is an integer greater than one and n is a channel number within the N channels, and B is an integer equal to or greater than one and b is a bit position within the B selectable RF attenuator cells (or cell). Each RF attenuator cell is designed to have at least two selectable states: (1) at least one attenuation state providing a corresponding specified level of signal attenuation, and (2) a bypass or reference state, providing essentially no significant attenuation. To be clear, the basic multi-channel architecture concepts and benefits can be realized using multi-state attenuator cell configurations (i.e., more than two selectable states).

The overall impedance of such a multi-channel DSA is a function of the parallel impedances of the N channels. The multi-channel nature of the DSA fundamentally improves transient glitch behavior. In particular, transition levels are reduced by 1/N, since the transient effect of switching any one attenuator cell in or out of circuit in one channel of the N channels is mitigated by all other in-circuit attenuator cells in the N−1 parallel channels. Each attenuator cell would commonly be an attenuator network, such as the well-known two-port Bridged-Tee, Pi, Tee, or L-pad type attenuator networks. In some embodiments, there is an advantage to using L-pad type attenuator cells, including using oriented versions of L-pad type attenuator cells in alternating channels (i.e., L-pad type attenuator cells that differ by the relative position of their respective shunt resistors with respect to their RF input and output ports, and which are directional in terms of impedance transformation).

The architecture of a multi-channel DSA enables a great degree of design flexibility, and in particular allows a designer to vary one or more of at least the following design parameters to accommodate a particular application:

the number of attenuator cells B per channel;
the number N of channels per DSA;
the attenuation value (bit weighting) of each attenuator cell per channel;
the maximum attenuation per channel; and
the characteristic impedance $Zo_n$ of each channel n of the N channels.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses a multi-channel digital step attenuator (DSA) architecture that fundamentally improves transient glitch behavior, provides for an MSB to LSB ratio more readily and uniformly achievable with various manufacturing processes, and provides for very fine resolution step sizes more readily and uniformly achievable with various manufacturing processes. The present invention further encompasses an improved multi-channel DSA architecture that allows use of a simple attenuator network within each attenuator cell that is compact, simple to implement, and exhibits good return loss behavior.

Basic Multi-Channel DSA Architecture

Figure 2A:
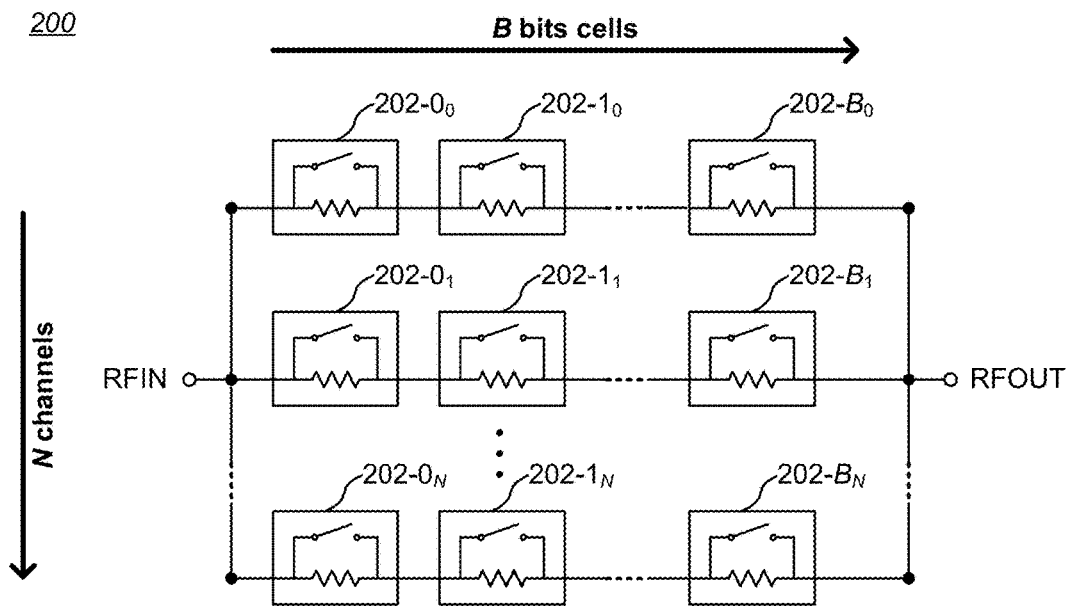
FIG. 2A is a block diagram of a first embodiment of a multi-channel DSA in accordance with the present invention.

FIG. 2A is a block diagram of a first embodiment of a multi-channel DSA 200 in accordance with the present invention. The multi-channel DSA 200 includes an array comprising N channels of B selectable RF attenuator cells 202-$b_n$, where N is an integer greater than one and n is a channel number within the N channels, and B is an integer equal to or greater than one and b is a bit position within the B selectable RF attenuator cell or cells series-connected between an input port and an output port. Each RF attenuator cell 202-$b_n$ is designed to have at least two selectable states: (1) at least one attenuation state providing a corresponding specified level of signal attenuation, and (2) a bypass or reference state, providing essentially no significant attenuation. However, the basic multi-channel architecture concepts and benefits can be realized using multi-state attenuator cell configurations (i.e., more than two selectable states); examples of multi-state attenuator cell configurations may be found in U.S. Pat. No. 9,531,359, issued on Dec. 27, 2016, entitled "Improved Multi-State Attenuator", assigned to the assignee of the present invention and hereby incorporated by reference.

The overall impedance of the multi-channel DSA 200 is a function of the parallel impedances of the N channels for the illustrated configuration. As the discussion below comparing the architecture of the multi-channel DSA 200 to conventional DSA designs shows, the multi-channel nature of the DSA 200 fundamentally improves transient glitch behavior. In particular, transition levels, whether glitch related or simply from LSB state changes, are reduced by 1/N, since the transient effect of switching any one attenuator cell 202-$b_n$ in or out of circuit in one channel of the N channels is mitigated by all other in-circuit attenuator cells 202-$b_n$ in the N−1 parallel channels.

Figure 1A:
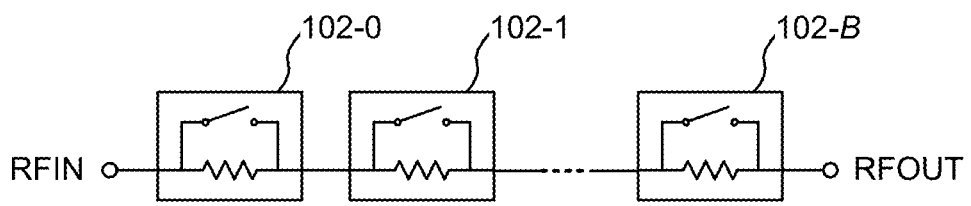
FIG. 1A is a block diagram of a prior art digital step attenuator (DSA).
Figure 1B:
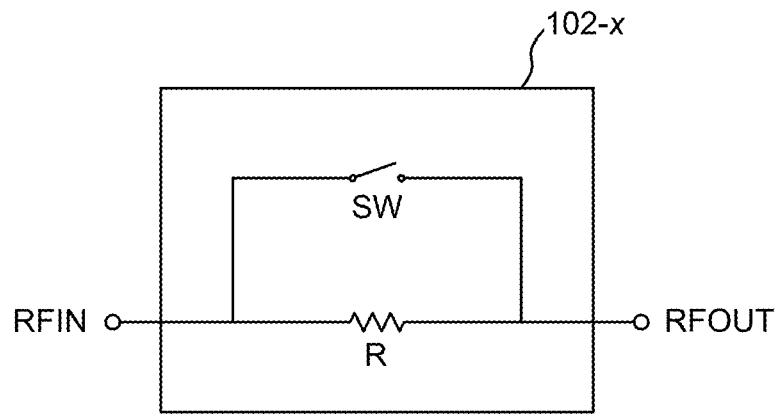
FIG. 1B is a block diagram of an enlarged attenuator cell from FIG. 1A.
Figure 2B:
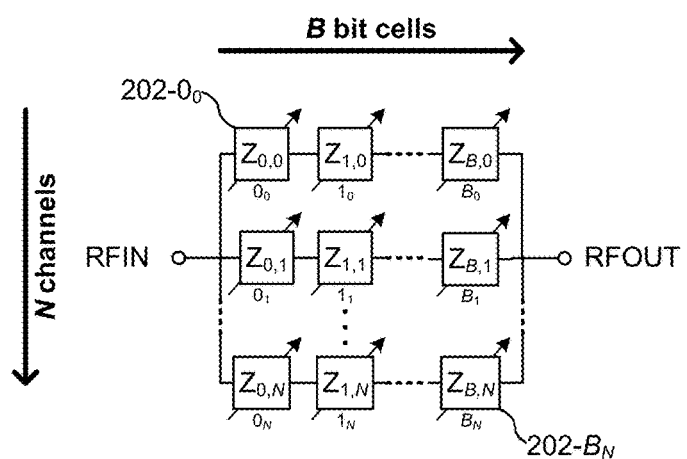
FIG. 2B is a more generalized block diagram of the first embodiment of a multi-channel DSA in accordance with the present invention.

The illustrated multi-channel DSA 200 of FIG. 2A uses the same symbols for each attenuator cell 202-$b_n$ as is used in FIG. 1A. FIG. 2B is a more generalized block diagram of the first embodiment of a multi-channel DSA in accordance with the present invention. In FIG. 2B, each attenuator cell is represented by a variable impedance symbol $Z_{b,n}$, along with a more compact notation for position within the multi-channel DSA array, $b_n$, where b and n are as defined above. For RF applications, each attenuator cell $b_n$ would commonly be an attenuator network, such as the well-known two-port Bridged-Tee, Pi, Tee, or L-pad type attenuator networks, examples of which are shown in FIGS. 7A-7E, described below. However, other attenuator cell structures may be used, including multi-state attenuator cells and/or cells that include inductive and/or capacitive elements (including parasitic inductive and/or capacitive elements).

The architecture of the multi-channel DSA 200 enables a great degree of design flexibility, and in particular allows a designer to vary one or more of at least the following design parameters to accommodate a particular application:

the number of attenuator cells B per channel;
the number N of channels per DSA;
the attenuation value (bit weighting) of each attenuator cell per channel;
the maximum attenuation per channel; and
the characteristic impedance $Zo_n$ of each channel n of the N channels.

A. Varying B and/or N

As B increases within a channel n, then the LSB of that channel is smaller for a specified attenuation range, and resolution increases. There are two common ways to determine the LSB for a given attenuation range. In one method, the total attenuation range is divided by $2^B$ to determine the LSB. Thus, for example, for the same maximum attenuation per channel (e.g., −6 dB) and binary weighting of attenuator cell values, setting B=3 would provide an LSB of $-6/2^3=-0.75$ dB, whiles setting B=4 would provide an LSB of $-6/2^4=-0.375$ dB. The number of attenuator cells per channel may vary, such that the bit counts differ by channel (e.g., $B_n \neq B_{n+1}$). However, with this method, it should be understood that adding up all attenuation values per channel does not exactly reach the maximum attenuation range. For example, for B=3 and a maximum attenuation per channel of −6 dB, the three attenuation values are −0.75, −1.5, and −3.0 dB, which sum to −5.25 dB rather than −6 dB.

Another way to determine the LSB for a specific attenuation range that assures that the sum of all attenuation values per channel equals the maximum attenuation range is to divide the total attenuation range by $(2^B-1)$. That is, by summing the "multiples of LSB" across the bit locations and then dividing the total range by this sum, the LSB value calculated will lead to exactly the range targeted. For example, for B=3 and a maximum attenuation per channel of −6 dB, then $(2^B-1)=7$, and the three attenuation values (to three decimal places) are −0.857, −1.714, and −3.429 dB, which sum to −6 dB. Another way to look at this is that there are $(2^B-1)$ state options with respect to the reference, minimum insertion loss state.

Figure 3:
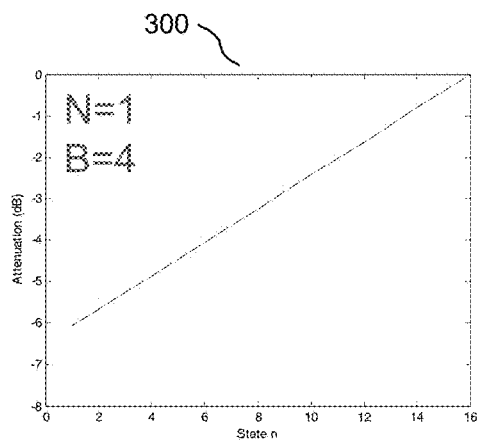
FIG. 3 is a graph of attenuation versus state of a modeled single-channel, 4-bit DSA.

As N increases in a multi-channel DSA 200, the parallel nature of the multiple channels results in attenuation levels versus selected state that are more Gaussian than for conventional DSAs. For example, FIG. 3 is a graph 300 of attenuation versus state of a modeled single-channel, 4-bit, binary weighted DSA. As illustrated, each increment of the 16 (i.e., $2^4$) selectable states results in an essentially linear increase in attenuation; however, the resolution is relatively low (e.g., 6 dB of attenuation over 16 states means that every step is about 0.40 dB of attenuation). Increasing the number of states would increase the resolution, but at a higher cost due to the precision required in manufacturing the resistors within the attenuator cells.

Figure 4:
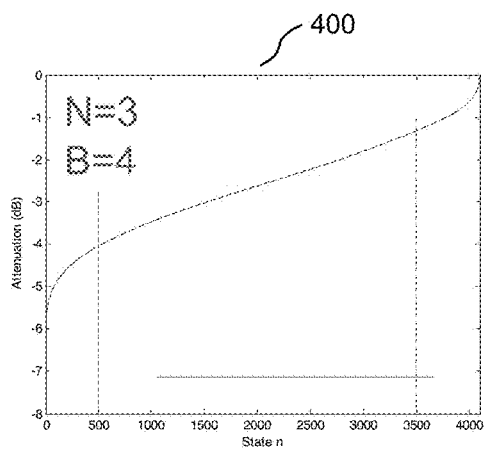
FIG. 4 is a graph of attenuation versus state of a modeled 3-channel, 4-bit multi-channel DSA.

In contrast, FIG. 4 is a graph 400 of attenuation versus state of a modeled 3-channel, 4-bit multi-channel DSA. As illustrated, the number of selectable states has increased to 4096 (i.e., 3 channels×4 bits=12 bits total, resulting in $2^{12}$ states). The attenuation levels versus selected state are more Gaussian than linear, but the resolution across the states increases dramatically, as does the point density. Over the entire state range, the maximum step size is less than 0.15 dB, already a better resolution than the single channel implementation having a 0.4 dB step size. When the extreme settings are ignored (noting that there are fewer than 1% of the possible states near the minimum and maximum attenuation levels), the maximum step size falls to less than 0.02 dB—a factor of more than 20 in increased resolution over the single channel implementation.

The architecture of the multi-channel DSA 200 also provides for an MSB to LSB ratio and very fine resolution step sizes more readily and uniformly achievable with various manufacturing processes. More particularly, the essentially two-dimensional array architecture of the multi-channel DSA 200 allows use of shorter strings of attenuator cells 202-$b_n$ per channel (i.e., smaller MSB to LSB ratios) and therefore larger LSBs while still achieving the same attenuation range and increased resolution compared to conventional circuits. This is so because the parallel multi-channel DSA 200 architecture provides a smaller effective value of LSB' per channel, equal to the nominal LSB of a channel divided by N: thus, LSB'=$LSB_{nominal}$/N. The range resistance values of the shorter MSB to LSB ratio of attenuator cells thus are more easily manufactured compared to the much smaller and more precise values needed in a conventional single channel design having equivalent range and resolution.

For example, as noted above, a conventional 1×10 DSA having a −6 dB total attenuation range over 10 serial attenuator cells requires an LSB attenuator cell value of −0.00586 dB, which is an extremely fine value that is difficult to repeatedly manufacture. However, the same effective LSB can be achieved with a multi-channel DSA with only 4 to 6 attenuator cells per channel. With a 4-bit multi-channel DSA, the LSB attenuator cell value can be more than 12 times larger than the LSB attenuator cell value of a conventional 1×10 DSA, and with a 6-bit multi-channel DSA, the LSB attenuator cell value can be more than 4 times larger than the LSB attenuator cell value of a conventional 1×10 DSA. As is known, manufacturing resistors having small values with precision is relatively difficult. Accordingly, multi-channel DSAs in accordance with the present invention are more easily manufactured with resulting higher integrated circuit yields.

Figure 5:
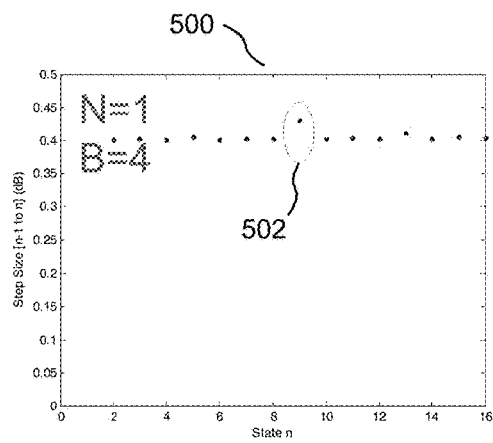
FIG. 5 is a graph of step size versus state of a modeled single-channel, 4-bit DSA.
Figure 6:
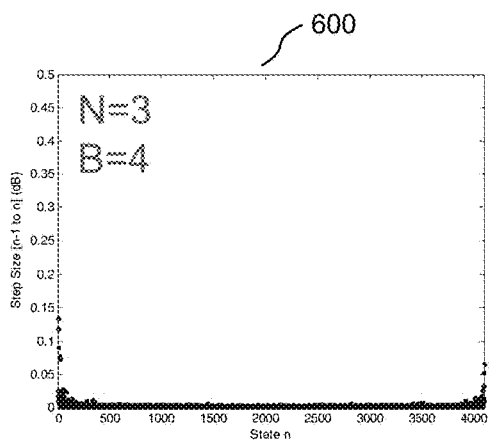
FIG. 6 is a graph of step size versus state of a modeled 3-channel, 4-bit multi-channel DSA.

As another example, FIG. 5 is a graph 500 of step size versus state of a modeled single-channel, 4-bit DSA. As illustrated, each increment of the 16 selectable states results in switching in approximately 0.4 dB of attenuation per step. Of note, a glitch occurs during one transition (i.e., the data point within the dotted oval 502) where multiple attenuator cells (L-pad type cells, in this case) concurrently switch. In contrast, FIG. 6 is a graph 600 of step size versus state of a modeled 3-channel, 4-bit multi-channel DSA. As illustrated, the number of selectable states has increased to 4096, and increments of the selectable states result in switching in less than about 0.05 dB of attenuation per step. For more than 99% of the range, the step size is less than about 0.02 dB.

B. Varying Bit Weighting

The attenuation value (bit weighting) of each attenuator cell per DSA channel may also be varied. For example, a binary bit weighting might be a useful choice, where each bit position has a weighting of two times the preceding bit position, as shown in rows 1 and 2 of TABLE 1 below for a 4-bit multi-channel DSA channel. However, other multiplicative bit weightings may be used, using integer or fractional multipliers. For example, rows 3 and 4 of TABLE 1 show a bit weighting of three (i.e., each bit position has a weighting three times the preceding bit position). Accordingly, as TABLE 1 shows, for the same amount of total attenuation (−6 dB in this example), the amount of attenuation assigned to each attenuator cell may be varied as a function of bit weight. Higher bit weighting results in a broader range of a channel's bit values.

TABLE 1

| Row # | Control Bit Position | | | | Sum | Units | Bit Weight |
|---|---|---|---|---|---|---|---|
| | 3 (MSB) | 2 | 1 | 0 (LSB) | | | |
| 1 (per bit weighting) | 8 | 4 | 2 | 1 | 15 | # | 2 |
| 2 | −3.2 | −1.6 | −0.8 | −0.4 | −6 | dB | |
| 3 (per bit weighting) | 27 | 9 | 3 | 1 | 40 | # | 3 |
| 4 | −4.05 | −1.35 | −0.45 | −0.15 | −6 | dB | |

The bit weighting across channels need not be uniform. Thus, for example, in a multi-channel DSA 200 where N=3, channel 1 might have a bit weight of 3.33, channel 2 might have a bit weight of 2.5, and channel 3 might have a bit weight of 2.0. Other bit weighting schemes may be used as well, such as thermometer weighting (i.e., an incremental or decremental change in attenuation value with each unit of change of state) or hybrid thermometer/multiplicative bit weightings. Accordingly, distinct channel bit weightings can be leveraged, for example, for improved step size versus extreme minimum and maximum attenuation range behavior.

C. Varying Per Channel Characteristic Impedances

As noted above, the overall impedance of the multi-channel DSA 200 is a function of the parallel impedances of the N channels for the illustrated configuration. As should be clear, the characteristic impedance $Zo_n$ of any one channel n out of the N channels can be varied by appropriately scaling the resistive element values (i.e., impedances $Z_{B,N}$) of the attenuator cells 202-$b_n$. While it may be useful to set the characteristic impedance of all channels of a multi-channel DSA to the same selected value (e.g., 150 ohms for each channel of an N=3 multi-channel DSA, resulting in a combined parallel impedance of 50 ohms), individual channels may be set to different characteristic impedances.

As the characteristic impedance $Zo_n$ of each channel n of the N DSA channels may be varied, the combined parallel impedance of all channels should be close to the targeted system level impedance to minimize reflections and mismatch losses. Considering a DSA comprising N channels of series-connected selectable RF attenuator cells 202-$b_n$ as shown in FIG. 2B, an impedance $Z_{CH}(n)$ can be computed for each channel. For example, if N=3, then the impedance of the multi-channel DSA is $Z_{DSA}=Z_{CH}(1)\|Z_{CH}(2)\|Z_{CH}(3)$. Thus, the nominal per channel n impedance is $Z_{CH}(n) \approx 3 \times Z_{DSA}$ for channels designed to have approximately equal impedances (e.g., if $Z_{DSA} \approx 50$ ohms, then $Z_{CH}$ should be about 150 ohms, although possibly higher if L-pad type attenuator cells are used).

As $Z_{CH}$ for a channel increases, power delivered through that channel will decrease; that is, for a constant voltage, less current can be delivered through a higher impedance channel. For example, an attenuator cell at a particular bit position in a higher impedance channel will attenuate less power than an otherwise similarly positioned attenuator cell in a lower impedance channel when the powers are summed at a common node. Accordingly, setting $Z_{CH}(n)$ can be leveraged to modify the attenuation behavior of the selected bit architecture.

Since P=I×V, if V is held constant from RFIN to RFOUT, then $I_{CH}(n)$ varies with $V/Z_{CH}(n)$. For example, for a multi-channel DSA with N=2, $I_{CH}(1)/I_{CH}(2)=Z_{CH}(2)/Z_{CH}(1)$, and the ratio of $Z_{CH}(2)/Z_{CH}(1)$ acts as an attenuation bit power scaling factor. The effect of combining two channels with different Zo values in a multi-channel DSA 200 is a ratioing of the bit values. As an example, TABLE 2 is an attenuator cell selection truth table that shows the total attenuation per channel and for the combination of the channels having different Zo values in a multi-channel DSA with N=2:

TABLE 2

| Low Zo Channel Attenuation (Zo = 75 ohms) | High Zo Channel Attenuation (Zo = 150 ohms) | Total DSA Attenuation (dB) |
|---|---|---|
| −4.0 | −4.0 | −4.0 |
| −4.0 | 0 | −1.22 |

TABLE 2-continued

| Low Zo Channel Attenuation (Zo = 75 ohms) | High Zo Channel Attenuation (Zo = 150 ohms) | Total DSA Attenuation (dB) |
|---|---|---|
| 0 | −4.0 | −0.63 |
| 0 | 0 | 0 |

As can be seen in TABLE 2, although the individual attenuation bit values are both −4 dB, multiple near-linear steps of −0.63 dB and −1.22 dB can be achieved by simply modifying the individual channel impedances.

Attenuator Cell Circuits

Figure 7A:
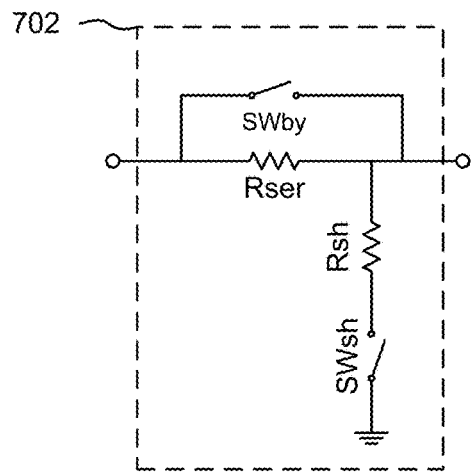
FIG. 7A is a schematic diagram of an L-pad type attenuator cell that may be used in the embodiments of FIG. 2A and FIG. 2B.

The selectable RF attenuator cells $202\text{-}b_e$ of FIG. 2A and FIG. 2B may be implemented with a number of circuits. For example, FIG. 7A is a schematic diagram of an L-pad type attenuator cell 702 that may be used in the embodiments of FIG. 2A and FIG. 2B. When closed, a bypass switch SWby places the attenuator cell 702 in the bypass state; to increase isolation, a shunt switch SWsh is opened during the bypass state. When the bypass switch SWby is open and the shunt switch SWsh is closed, the combination of a series resistance Rser and a shunt resistance Rsh provides a selected attenuation level, depending on their relative resistance values.

Figure 7B:
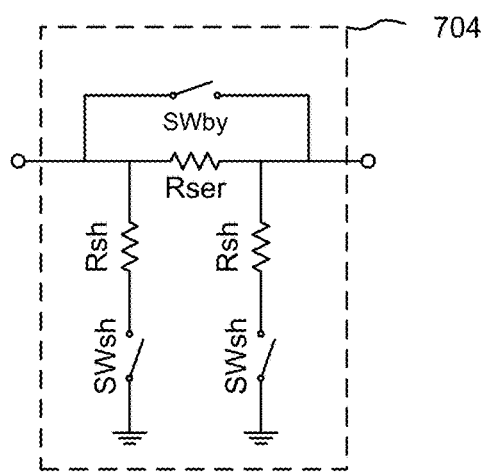
FIG. 7B is a schematic diagram of a Pi-type attenuator cell that may be used in the embodiments of FIG. 2A and FIG. 2B.

FIG. 7B is a schematic diagram of a Pi-type attenuator cell 704 that may be used in the embodiments of FIG. 2A and FIG. 2B. When closed, a bypass switch SWby places the attenuator cell 704 in the bypass state; to increase isolation, shunt switches SWsh are opened during the bypass state. When the bypass switch SWby is open and the shunt switches SWsh are closed, the combination of a series resistance Rser and two shunt resistances Rsh provides a selected attenuation level, depending on their relative resistance values.

Figure 7C:
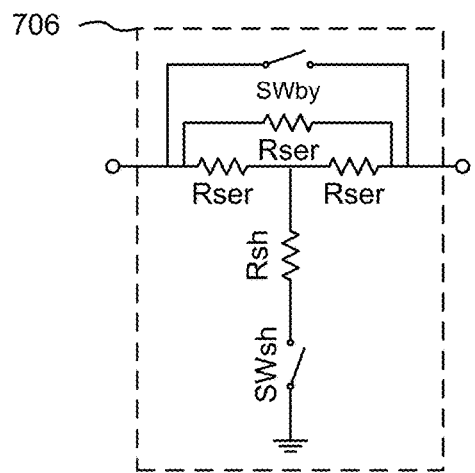
FIG. 7C is a schematic diagram of a Bridged-Tee type attenuator cell that may be used in the embodiments of FIG. 2A and FIG. 2B.

FIG. 7C is a schematic diagram of a Bridged-Tee type attenuator cell 706 that may be used in the embodiments of FIG. 2A and FIG. 2B. When closed, a bypass switch SWby places the attenuator cell 706 in the bypass state; to increase isolation, a shunt switch SWsh is opened during the bypass state. When the bypass switch SWby is open and the shunt switch SWsh is closed, the combination of series/parallel resistances Rser and a shunt resistance Rsh provides a selected attenuation level, depending on their relative resistance values.

Figure 7D:
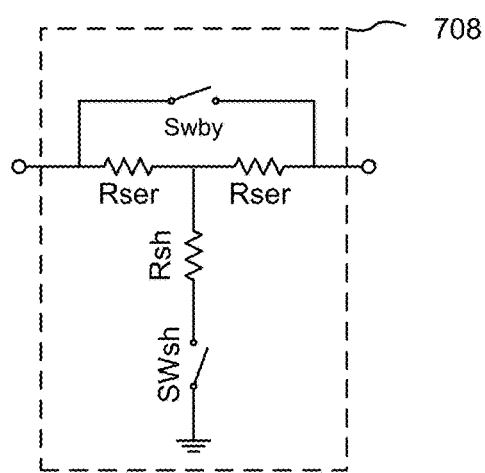
FIG. 7D is a schematic diagram of a Tee-type attenuator cell that may be used in the embodiments of FIG. 2A and FIG. 2B.

FIG. 7D is a schematic diagram of a Tee-type attenuator cell 708 that may be used in the embodiments of FIG. 2A and FIG. 2B. When closed, a bypass switch SWby places the attenuator cell 708 in the bypass state; to increase isolation, a shunt switch SWsh is opened during the bypass state. When the bypass switch SWby is open and the shunt switch SWsh is closed, the combination of series resistances Rser and a shunt resistance Rsh provides a selected attenuation level, depending on their relative resistance values.

As should be clear, the control signals for the bypass switch SWby and the shunt switch SWsh of the above attenuator cell circuits are complementary. Further examples and discussion of bypassable attenuator cells may be found in U.S. Pat. No. 9,397,635, issued on Jul. 19, 2016, entitled "Segmented Attenuator with Glitch Reduction", and in U.S. Pat. No. 9,531,359, issued on Dec. 27, 2016, entitled "Improved Multi-State Attenuator", both assigned to the assignee of the present invention and hereby incorporated by reference.

Figure 7E:
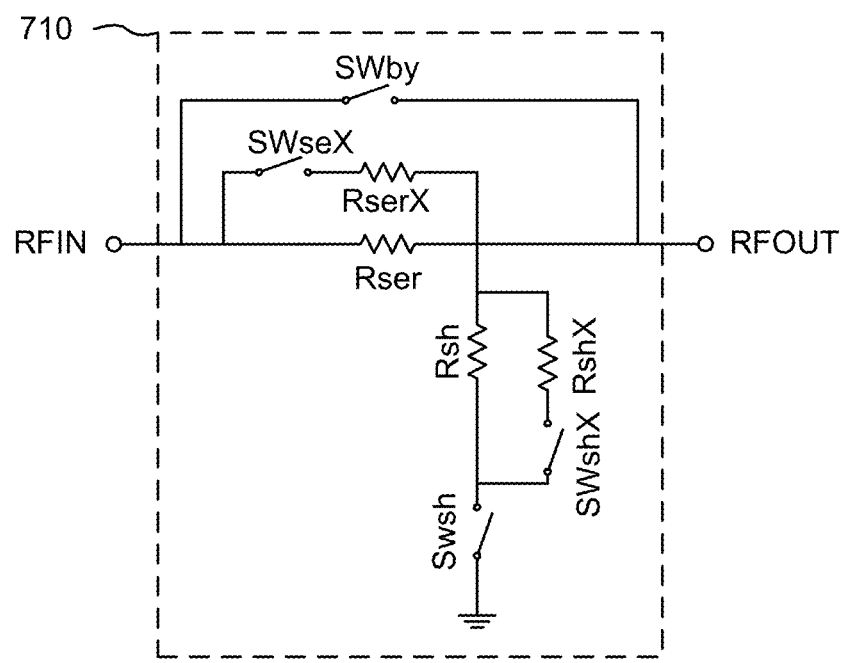
FIG. 7E is a schematic diagram of a multi-valued L-pad type attenuator cell that may be used in the embodiments of FIG. 2A and FIG. 2B.

Other circuits may be used for each attenuator cell to provide at least one selected amount of impedance. For example, FIG. 7E is a schematic diagram of a multi-state L-pad type attenuator cell 710 that may be used in the embodiments of FIG. 2A and FIG. 2B. As in FIG. 7A, when closed, a bypass switch SWby places the attenuator cell 710 in the bypass state; to increase isolation, a shunt switch SWsh is opened during the bypass state. When the bypass switch SWby is open and the shunt switch SWsh is closed, and extra series and shunt switches SWseX and SWshX are open, the combination of a series resistance Rser and a shunt resistance Rsh provides a first selected attenuation level, depending on their relative resistance values. By closing extra series and shunt switches SWseX and SWshX, an extra resistance RserX is coupled to the signal path between RFIN to RFOUT in parallel with Rser, while an extra resistance RshX is coupled to the shunt path in parallel with Rsh. Accordingly, switching in RserX and RshX provides a second selected attenuation level for the attenuator cell 710.

Another way of looking at the multi-state cell configuration of FIG. 7E is that it enables a tunable characteristic impedance $Zo_n$ for each channel n of the multi-channel DSA 200. For example, if the nominal characteristic impedance $Zo_n$ of a channel n is 50 ohms with all RserX and RshX resistances in the channel switched out of circuit, switching in RserX and RshX within a cell 710 can be used to shift the characteristic impedance $Zo_n$ of the channel to another value, such as 40 ohms or 60 ohms. In alternative embodiments for narrowband applications, the impedance shifting functions of the RserX and RshX resistances can be replaced by reactive tuning circuitry. Alternatively, a multi-state cell configuration enables a tunable characteristic impedance $Zo_n$ for each cell (which may be useful in the case of the configuration shown in FIG. 8, for example).

Other multi-state attenuator cells that may be used in conjunction with embodiments of the present invention are set forth in U.S. Pat. No. 9,531,359, referenced above, and in U.S. patent application Ser. No. 15/339,737, filed Oct. 31, 2016, entitled "Multi-State Attenuator", which is assigned to the assignee of the present invention and hereby incorporated by reference.

Note that the selectable impedance circuits used for the attenuator cells $202\text{-}b_n$ of a multi-channel DSA 200 need not be of identical architectures; thus, as one example, some attenuator cells $202\text{-}b_n$ may be implemented with Pi-type attenuator cells, while other attenuator cells $202\text{-}b_n$ may be implemented with Bridged-Tee type attenuator cells.

Alternative Multi-Channel DSA Architectures

The regular array of attenuator cells $202\text{-}b_n$ of the multi-channel DSA 200 of FIG. 2B is a convenient configuration, but the invention encompasses variant architectures.

Figure 8:
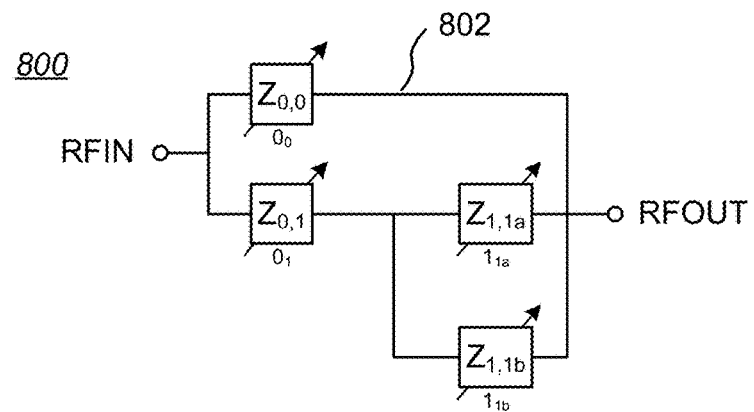
FIG. 8 is a schematic view of a second embodiment of a multi-channel DSA having "branching" attenuator cells within at least one channel.

For example, FIG. 8 is a schematic view of a second embodiment of a multi-channel DSA 800 having "branching" selectable attenuator cells within at least one channel. More specifically, while a first channel 802 is shown as including a single attenuator cell $0_0$, a second channel 804 is shown as including a first attenuator cell $0_1$ in series with a pair of parallel attenuator cells $1_{1a}$ and $1_{1b}$. As should be clear, additional channels may be included, more than one channel may have "branching" attenuator cells, one or more "branches" may include more than one attenuator cell, and the level of "branching" of attenuator cells may be increased per channel (i.e., branches within branches).

Figure 9:
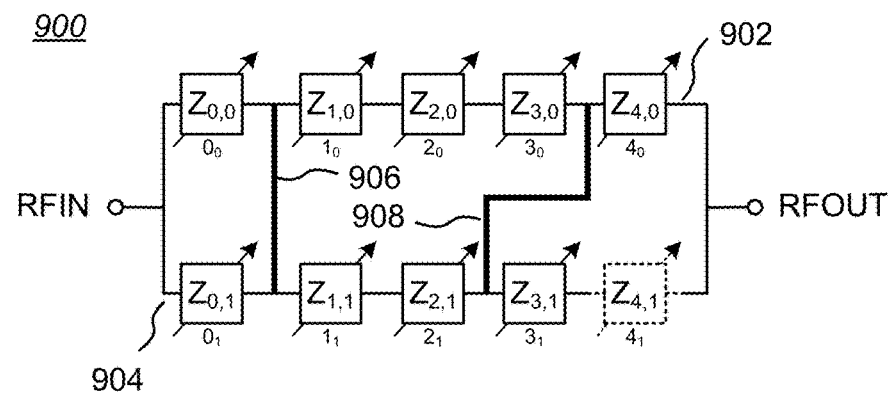
FIG. 9 is a schematic view of a third embodiment of a multi-channel DSA having at least one interconnection between channels.

As another example, FIG. 9 is a schematic view of a third embodiment of a multi-channel DSA 900 having at least one interconnection between channels. More specifically, the DSA 900 includes a first channel 902 and a second channel 904 each comprising 5 attenuator cells. One or more interconnections between channels can be made, such as between adjacent (i.e., same bit position) attenuator cells (interconnection 906) or between offset (i.e., different bit positions) attenuator cells (interconnection 908); as should be clear, channel connections at RFIN and RFOUT are not "interconnections".

As noted above, the number of attenuator cells per channel may vary such that the bit counts differ by channel (e.g., $B_n \neq B_{n+1}$). Thus, for example, referring to FIG. 9, the last attenuator cell $4_1$ in the second channel 904 could be omitted, so that the bit count of the first channel 902 is B=5, while the bit count of the second channel 904 is B=4.

Figure 10A:
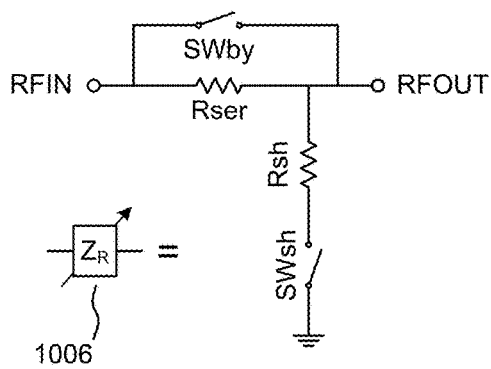
FIG. 10A is a schematic diagram of a "right handed" L-pad type attenuator.
Figure 10B:
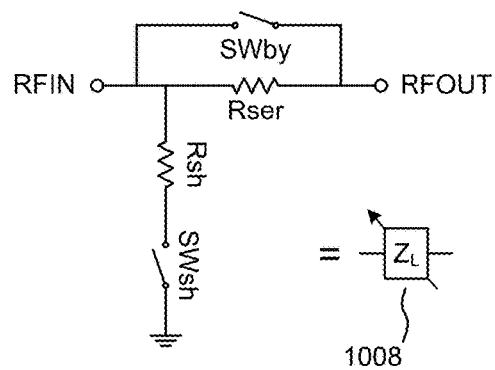
FIG. 10B is a schematic diagram of a "left handed" L-pad type attenuator.

In yet another variant, the attenuator cells in some channels may comprise "right handed" L-pad type attenuators, while the attenuator cells in other channels may comprise "left handed" L-pad type attenuators. For example, FIG. 10A is a schematic diagram of a "right handed" L-pad type attenuator 1002, while FIG. 10B is a schematic diagram of a "left handed" L-pad type attenuator 1004. The two types differ by the relative position of the shunt resistor Rsh with respect to the RFIN and RFOUT ports, and are directional in terms of impedance transformation. Each type can be respectively represented by oriented variable impedance symbols 1006 and 1008, respectively. Both types are compact and simple to implement.

As is known, L-pad attenuators supply an impedance match in one direction only (i.e., they are asymmetric). For example, for the "right handed" L-pad type attenuator 1002 of FIG. 10A, assume 50Ω loads are coupled to RFIN and RFOUT. Further assume that the input impedance Zin at RFIN for the L-pad type attenuator 1002 is set as 50Ω to match the input load impedance and to permit calculating Rser and Rsh. The output impedance Zout at RFOUT for the L-pad type attenuator 1002 will vary as a function of the L-pad behavior and Rser and Rsh values. For 2 dB of attenuation, Rser will be about 10.28Ω, Rsh will be about 193.12Ω, and the resulting value of Zout will be about 45.94Ω. Accordingly, in this example, the "right handed" L-pad type attenuator 1002 will exhibit about a −27 dB return loss. For a "left handed" L-pad type attenuator 1004, the directionality of the impedances Zin, Zout are reversed.

Figure 11A:
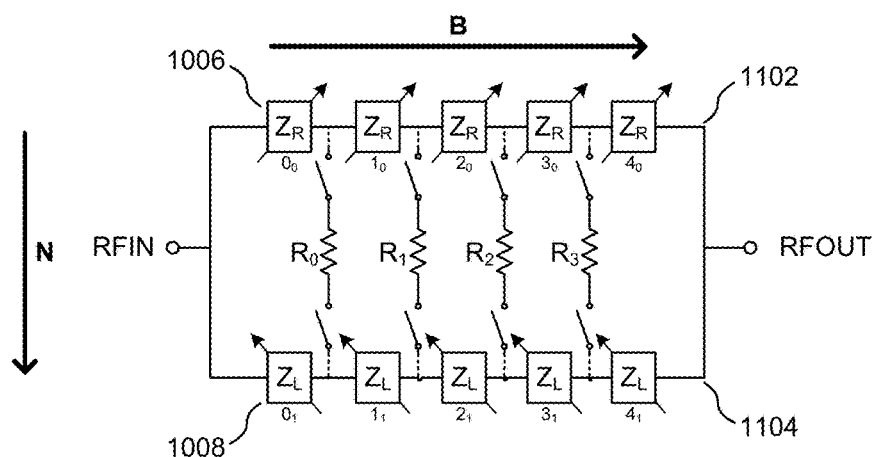
FIG. 11A is a schematic diagram of a multi-channel DSA that includes a first channel of "right handed" L-pad type attenuator cells, and a second channel of "left handed" L-pad type attenuator cells.

FIG. 11A is a schematic diagram of a multi-channel DSA 1100 that includes a first channel 1102 of "right handed" L-pad type attenuator cells 1006 having an impedance of $Z_R$ (which may not be the same for each cell), and a second channel 1106 of "left handed" L-pad type attenuator cells 1008 having an impedance of $Z_L$ (again, which may not be the same for each cell). As should be clear, the concept of alternating oriented variable impedances can be extended to additional channels; for example, "right handed" L-pad type attenuator cells 1006 could be used when n is even, and "left handed" L-pad type attenuator cells 1008 could be used when n is odd.

As noted above, L-pad attenuators supply an impedance match in one direction only; by using alternating channel orientations of L-pad type attenuator cells, such impedance match directionality can be offset, improving the voltage standing wave ratio (VSWR) compared to conventional single channel DSA configuration using L-pad attenuators.

Figure 11B:
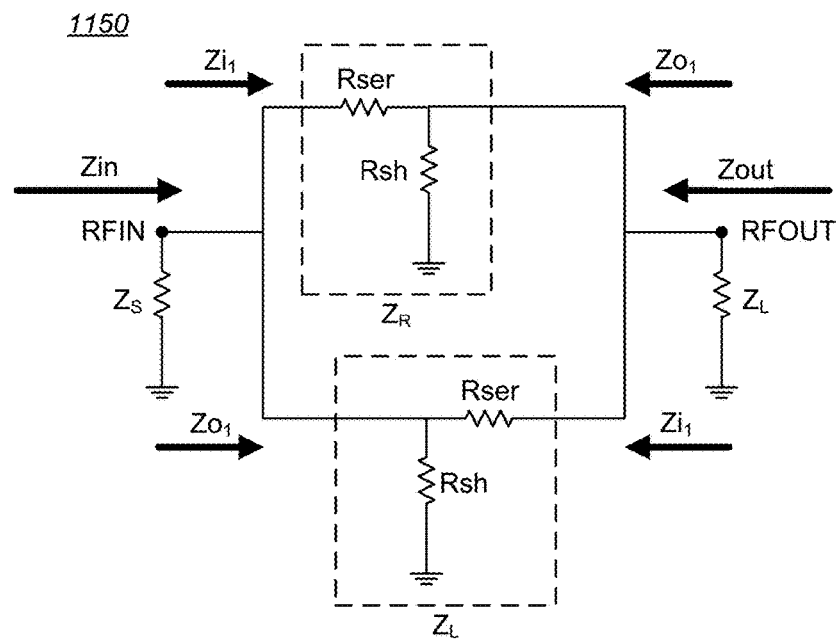
FIG. 11B is a simplified schematic diagram of alternating orientation L-pad type attenuator cells.

FIG. 11B is a simplified schematic diagram 1150 of alternating orientation L-pad type attenuator cells. In this simplified example, the number of channels N is two, and the number of bits B per channel is one. Assume that the input load Zs and the output load $Z_L$ have an impedance of 50Ω each, and further assume that the input impedance Zin at RFIN is set as 50Ω to match the input load impedance Zs. As above, the output impedance Zout at RFOUT for the L-pad type attenuators will vary as a function of the L-pad behavior and Rser and Rsh values. Setting Rser to about 10.28Ω, and Rsh to about 193.11 each, $Zi_1=2 \times Zin=100Ω$ and $Zo_1=2 \times Zout=91.88Ω$. Using the alternating L-pad configuration for each path, Zout is now equal to $Zi_1/Zo_1=47.88Ω$, which is closer to the desired $Z_L$ value of 50Ω than would be the case with non-alternating orientation L-pad type attenuator cells (see also TABLE 3 below). In such an alternating orientation, the configuration effectively splits the mismatch evenly between Input and Output ports. Note that in some embodiments, other types of attenuators may be included within channels that include alternating orientation L-pad type attenuator cells, and not all channels need have alternating orientation L-pad type attenuator cells.

In addition, VSWR can be further improved for any number of channels by skewing the Rser and Rsh values of the individual L-pad attenuator bits, which is equivalent to changing the nominal impedance of the bit and channel, $Zo_{CHAN}$. Using the example of FIG. 11B, the values of Rser and Rsh can be increased while holding attenuation constant to skew the characteristic impedance Zo of each channel. TABLE 3 below sets forth one example of "ideal" values for Rser and Rsh for a specific circuit embodiment using alternating orientation L-pad type attenuator cells. The column for N=1 shows the per channel values for Rser and Rsh and the resulting values of Zin and Zout. The column for N=2 shows the sum of both channels for Rser and Rsh and the resulting values of Zin and Zout. Lastly, the column for N=2+skew shows the sum of both channels where Rser and Rsh have an added amount of impedance (i.e., "skew") and the resulting values of Zin and Zout. As can be seen, by adding an additional amount of skew impedance, nearly perfect 50Ω values (i.e., 50.01Ω in this example) can be achieved for both Zin and Zout in this embodiment. The amount of skew to be added can readily be determined numerically.

TABLE 3

| | N = 1 single channel | N = 2 2 channels, alternating orientation | N = 2 + skew 2 channels, alternating orientation + skew |
|---|---|---|---|
| Rser | 10.28 | 20.57 | 23.28 |
| Rsh | 193.11 | 386.21 | 432.00 |
| Zin | 50.00 | 47.88 | 50.01 |
| Zout | 45.94 | 47.88 | 50.01 |

(all values in ohms)

FIG. 11A also illustrates an optional configuration that can be used with attenuator cells of any type (not just the oriented L-pad type attenuators 1006, 1008 illustrated). One or more selectable cross-channel resistors Rx can be selectively switched (actuated) into circuit so as to form a matrix of cross-connected attenuator cells between at least one selected pair of channels (the optional nature is indicated by dotted lines). The matrix configuration enables a very large set of connection options between RFIN and RFOUT for the set of attenuator cells. Note that both B, N, and bit weighting per channel can be varied, as described above, and that the cross-connected attenuator cells need not be in adjacent channels; that is, cross-connections can be made to non-adjacent channels, in essentially a mesh or partial mesh configuration. Further, while the selectable cross-channel resistors Rx are shown as connecting attenuator cells of the same bit order, selectable cross-channel resistors Rx may also be used to connect offset attenuator cells, similar to the configuration shown in FIG. 8, again in essentially a mesh or partial mesh configuration.

Process Variation Insensitivity

Figure 12:
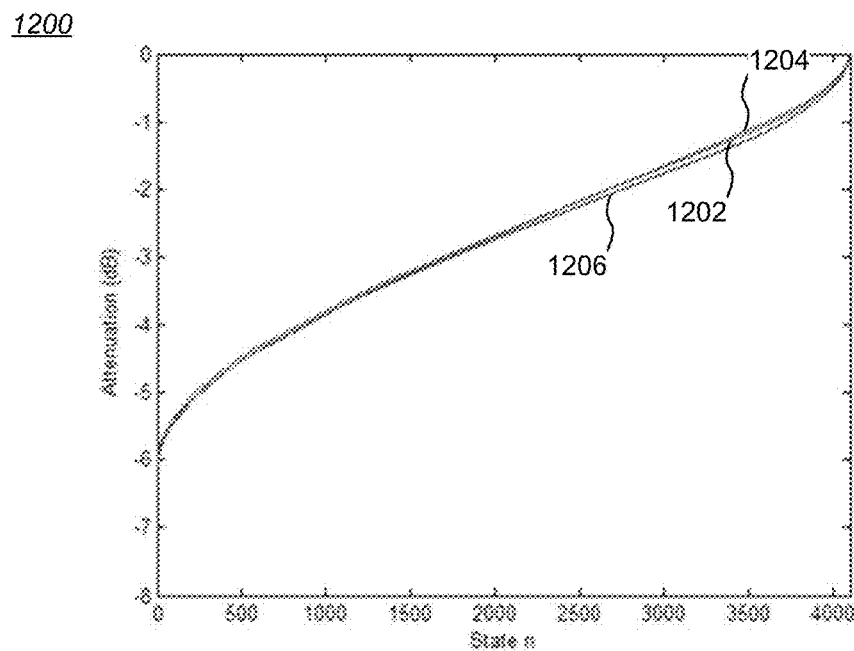
FIG. 12 is a graph of attenuation as a function of state for a modeled 2×6 multi-channel DSA, showing variance of attenuation due to process variations.

Another benefit of the multi-channel DSA architecture is that circuit embodiments are relatively insensitive to process variations. For example, FIG. 12 is a graph 1200 of attenuation as a function of state for a modeled 2×6 multi-channel DSA, showing variance of attenuation due to process variations. In the illustrated example, graph line 1202 represents the nominal value for the resistors within the 12 attenuator cells comprising the multi-channel DSA (in this example, the attenuator cells were modeled as L-pad type attenuators). In comparison, graph line 1204 represents a 20% increase in resistance within all attenuator cells due to process variations, while graph line 1206 represents a 20% decrease in resistance within all attenuator cells due to process variations. As the close overlap of graph line 1202 by graph lines 1204 and 1206 indicates, despite a large change in component resistance due to process variations, attenuation as a function of state varies very little over the entire range of states. Similar results were obtained for a modeled 3×4 multi-channel DSA (not shown), but with slightly wider deviation from nominal above about state 3200.

The stability of the multi-channel DSA architecture with respect to process variations is a result of the 1/N factor discussed above. For example, the resistors within attenuator cells in a 3×6 multi-channel DSA can have a resistance about 3 times larger (thus, easier to manufacture precisely) than the resistors within a conventional 1×6 DSA having a comparable LSB attenuation value. As one example, in one model of a conventional 1×6 DSA having an LSB of 0.095238 dB, the minimum resistance value was 0.61067 ohms, while in a 3×6 multi-channel DSA in accordance with the present invention and having an LSB of 0.095238 dB, the minimum resistance value was 1.7622 ohms, or 3 times larger. Note also that by increasing the size of the resistors, the sizes of the FETs per channel can be reduced by the same factor. Accordingly, integrated circuit die area is not greatly impacted by using multi-channel DSAs, and multi-channel DSAs provide substantially increased step resolution without the design challenges of conventional DSAs.

COMPARATIVE EXAMPLES

Figure sets 13-15 compare three different DSA configurations to illustrate the benefits of embodiments of a multi-channel DSA compared to a conventional DSA.

Figure 13A:
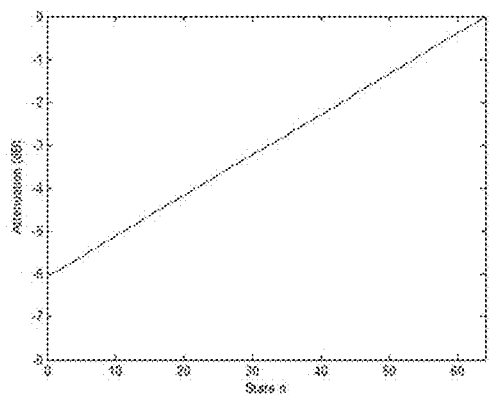
FIG. 13A is a graph showing attenuation as a function of state for one model of a conventional 1×6 DSA.
Figure 13B:
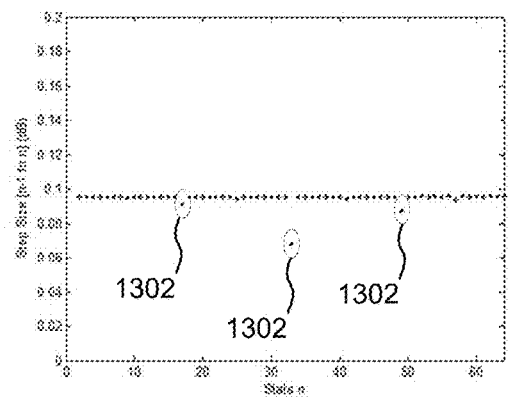
FIG. 13B is a graph showing step size as a function of state for the DSA of FIG. 13A.
Figure 13C:
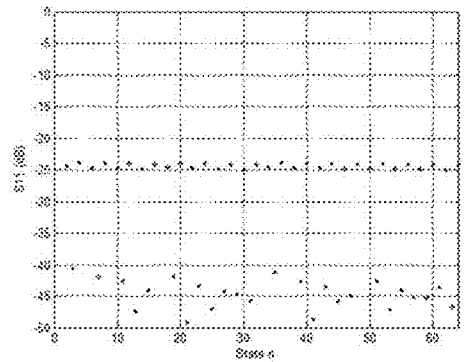
FIG. 13C is a graph of the S11 scattering parameter (return loss) as a function of state for the DSA of FIG. 13A.
Figure 13D:
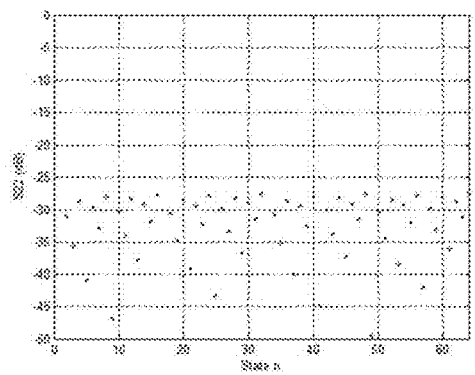
FIG. 13D is a graph of the S22 scattering parameter (return loss) as a function of state for the DSA of FIG. 13A.

More specifically, FIG. 13A is a graph 1300 showing attenuation as a function of state for one model of a conventional 1×6 DSA; FIG. 13B is a graph 1310 showing step size as a function of state for the DSA of FIG. 13A; FIG. 13C is a graph 1320 of the S11 scattering parameter (return loss) as a function of state for the DSA of FIG. 13A; and FIG. 13D is a graph 1330 of the S22 scattering parameter (return loss) as a function of state for the DSA of FIG. 13A. Accordingly, the conventional 1×6 DSA uses 6 control bits to set 64 states.

Figure 14A:
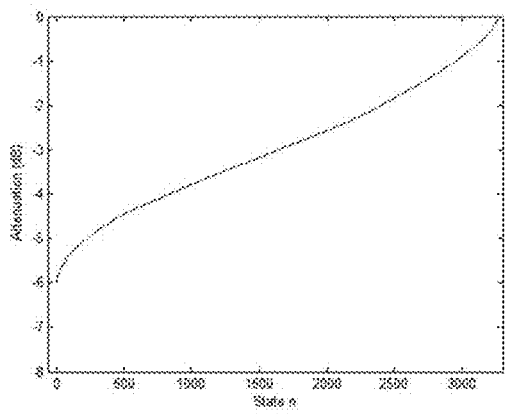
FIG. 14A is a graph showing attenuation as a function of state for one model of a 2×6 multi-channel DSA.
Figure 14C:
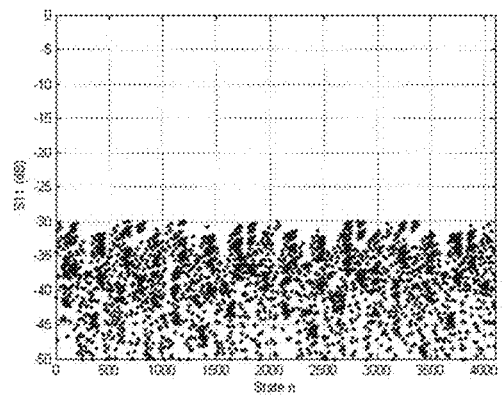
FIG. 14C is a graph of the S11 scattering parameter as a function of state for the multi-channel DSA of FIG. 14A.
Figure 14B:
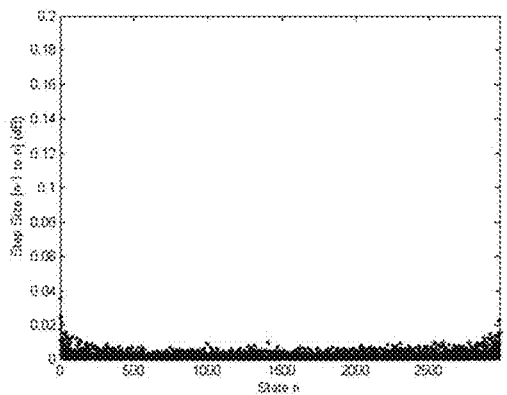
FIG. 14B is a graph showing step size as a function of state for the multi-channel DSA of FIG. 14A.
Figure 14D:
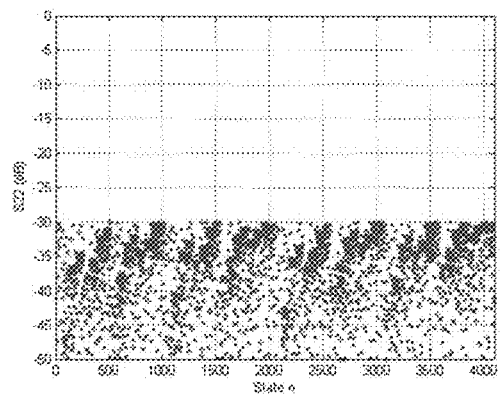
FIG. 14D is a graph of the S22 scattering parameter as a function of state for the multi-channel DSA of FIG. 14A.

FIG. 14A is a graph 1400 showing attenuation as a function of state for one model of a 2×6 multi-channel DSA; FIG. 14B is a graph 1410 showing step size as a function of state for the multi-channel DSA of FIG. 14A; FIG. 14C is a graph 1420 of the S11 scattering parameter as a function of state for the multi-channel DSA of FIG. 14A; and FIG. 14D is a graph 1430 of the S22 scattering parameter as a function of state for the multi-channel DSA of FIG. 14A. Accordingly, the 2×6 multi-channel DSA uses 12 control bits to set 4096 states.

Figure 15A:
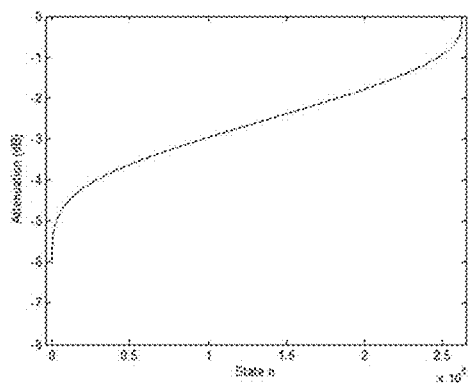
FIG. 15A is a graph showing attenuation as a function of state for one model of a 3×6 multi-channel DSA.
Figure 15C:
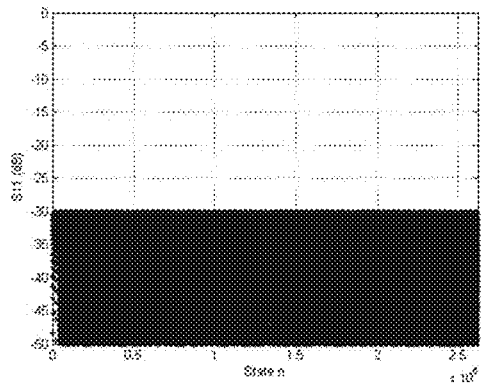
FIG. 15C is a graph of the S11 scattering parameter as a function of state for the multi-channel DSA of FIG. 15A.
Figure 15B:
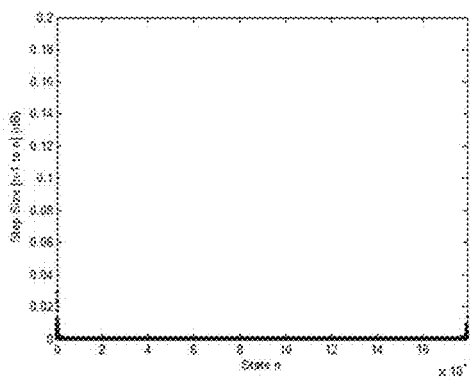
FIG. 15B is a graph showing step size as a function of state for the multi-channel DSA of FIG. 15A.
Figure 15D:
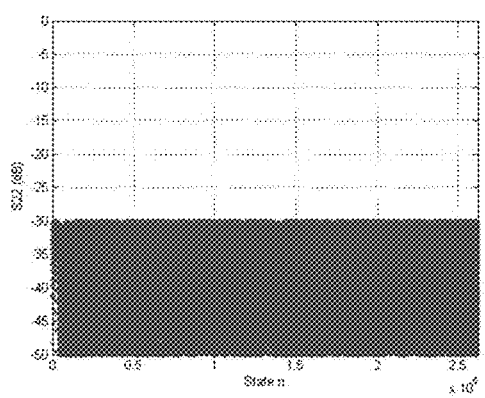
FIG. 15D is a graph of the S22 scattering parameter as a function of state for the multi-channel DSA of FIG. 15A.

FIG. 15A is a graph 1500 showing attenuation as a function of state for one model of a 3×6 multi-channel DSA; FIG. 15B is a graph 1510 showing step size as a function of state for the multi-channel DSA of FIG. 15A; FIG. 15C is a graph 1520 of the S11 scattering parameter as a function of state for the multi-channel DSA of FIG. 15A; and FIG. 15D is a graph 1530 of the S22 scattering parameter as a function of state for the multi-channel DSA of FIG. 15A. Accordingly, the 3×6 multi-channel DSA uses 18 control bits to set 262,144 states (a 4096× increase in the number of possible control combinations compared to a conventional 1×6 DSA).

While the attenuation of the conventional 1×6 DSA is quite linear, the step size is 5 to 10 times larger or more than the step sizes of the 2×6 and 3×6 multi-channel DSAs. The conventional 1×6 DSA also exhibits significant glitches during state changes (see the data points within the dotted ovals 1302 in FIG. 13B). Further, for the conventional 1×6 DSA, the S11 return loss is above −25 dB for about half the states, and the S22 return loss is above −30 dB for a close to half of the states. In contrast, the number of states for the 2×6 and 3×6 multi-channel DSAs is so comparatively large that states can be discarded that would result in an S11 or S22 return loss above about −30 dB (in FIGS. 14C, 14D, 15C, and 15D, the data includes a limit check of 30 dB).

TABLE 4 below shows data for three specific modeled circuits corresponding to figure sets 13×15. For a target maximum attenuation of −6 dB, the maximum step size of the conventional 1×6 DSA is significantly larger than for the two multi-channel DSAs (constrained to exclude states below the $5^{th}$ and above the $95^{th}$ percentiles of attenuation range in this example). Similarly, the ratio of the maximum step size to the maximum attenuation range for the conventional 1×6 DSA is significantly larger than for the two multi-channel DSAs. Lastly, applying a limit of 30 dB or more return loss as a cutoff for valid states, the percentage of valid attenuation states for the two multi-channel DSAs is significantly higher than for the conventional 1×6 DSA.

TABLE 4

| DSA type | 1 × 6-Bit | 2 × 6-Bit | 3 × 6-Bit | Units |
| --- | --- | --- | --- | --- |
| Target Max Attenuation | −6 | −6 | −6 | dB |
| Max Step dB (90%) | 0.0958 | 0.0103 | 0.00035 | dB |
| Max Step/Max Attenuation | 1.59 | 0.172 | 0.0059 | % dB |
| % Valid (>30 dB Return Loss) | 50 | 74.8 | 68.4 | % |

By utilizing a 3×6 multi-channel DSA instead of a conventional 1×6 DSA, the maximum step size improves from about 0.096 dB to about 0.0004 dB, which is about a 23 dB difference in resolution.

If the return loss requirement is reduced, the number of valid attenuation states for the two multi-channel DSAs increases substantially, while still providing a maximum step size that is less than the maximum step size of the conventional 1×6 DSA. For example, the modeled 2×6 multi-channel DSA has a maximum step size of about 0.0528 dB when the return loss requirement is reduced to 15 dB from 30 dB, compared to a maximum step size of about 0.094 dB for the conventional 1×6 DSA. More generally, the maximum return loss level for a DSA can be relaxed in return for an increased number of usable states, and thus reach a more optimum performance solution. In the specific 2×6 example from TABLE 3, keeping the maximum step size the same but reducing the return loss requirement to 15 dB, the total number of acceptable states increases from 74.7% to 100% (i.e., 4096 states).

Characterization

In order to characterize attenuation levels as a function of in a multi-channel DSA, an embodiment of the circuit may be tested to measure actual attenuation level versus state. The resultant characterization may be stored in a look-up table (LUT) that maps state to specific attenuator cells required to be activated to achieve a desired attenuation level. The LUT may be implemented as a read-only memory device (e.g., ROM, PROM, EAROM, EPROM, etc.) which may be used in conjunction with conventional control circuitry scaled up to include the necessary control lines for the number of attenuator cells within the multi-channel DSA. States that lead to performance metrics outside a desired specification may be omitted from the LUT.

Alternatively, samples of a multi-channel DSA circuit may be tested and characterized, or a model of such a circuit may be characterized, with the resultant characterization stored in an LUT for a production run of such circuits.

The test parameters for characterization of a multi-channel DSA may include one or more specified frequency ranges, one or more temperature ranges, one or more voltage ranges, and any other desired operating and/or environmental parameters. For example, the combination of attenuator cells required to achieve a desired attenuation level may vary with frequency or temperature; a sufficiently large LUT can be used to take into account such a variable.

Characterization of a multi-channel DSA may further include different LUT entries to accommodate manufacturing process variations, with a particular set of entries selected based on tested characteristics of an integrated circuit die embodying a multi-channel DSA. For example, a first set of LUT entries may be assigned to integrated circuit (IC) embodiments of a multi-channel DSA that test at a specified nominal level for resistor characteristics, while a second set of LUT entries may be assigned to ICs that test at the high end of resistor values (e.g., +20%) and a third set of LUT entries may be assigned to ICs that test at the low end of resistor values (e.g., −20%). In any case, characterization LUTs may be part specific.

Application with Coplanar Waveguide

The multi-channel DSA architecture described above is well suited for applications that use high frequency, coplanar wave guides (CPWGs). As is known in the art, a CPWG is a type of electrical planar transmission line used to convey microwave-frequency signals and which may be fabricated as part of a monolithic integrated circuit. Conventional CPWGs consist of a central signal line formed as a conductive trace on a dielectric substrate and flanked by a pair of return conductive traces; all three conductive traces are on the same side of the substrate, and hence are coplanar. The return conductive traces are separated from the central signal line conductive trace by a gap, which generally has an unvarying width along the length of the signal line.

Figure 16:
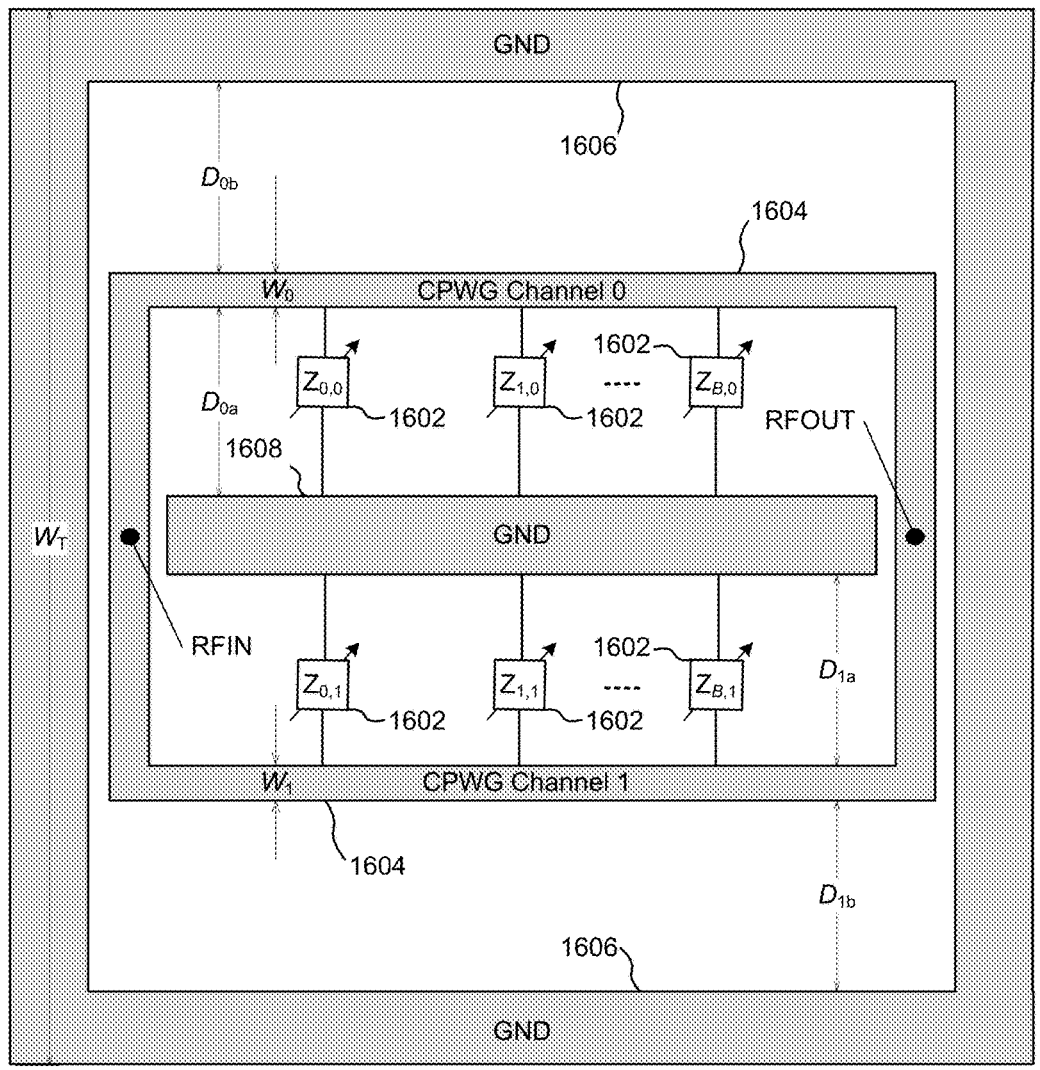
FIG. 16 is a stylized view of a coplanar waveguide (CPWG) embodiment of a multi-channel DSA.

FIG. 16 is a stylized view of a coplanar waveguide (CPWG) embodiment 1600 of a multi-channel DSA. The illustrated example shows a stylized layout for the CPWG and schematic depictions of two channels of attenuator cells 1602. Each channel (i.e., Channel 0 and Channel 1) of the CPWG includes a central conductive trace 1604 flanked by two extents of grounded return conductive traces 1606, 1608; as shown, both channels share one grounded return conductive trace 1608, which facilitates a compact layout of the circuit. Signals are applied to Channels 0 and 1 through an RFIN port and conveyed along the channels to an RFOUT port.

One or more attenuator cells 1602 (shown schematically) may be connected along the length of each channel between the central conductive traces 1604 and one or both flanking return conductive traces 1606, 1608 (in the illustrated embodiment, connections are made only to the shared return conductive trace 1608, but that is not a limitation). The array of attenuator cells 1602 functions as described above (see the description of FIG. 2A and FIG. 2B in particular).

The characteristic impedance $Z_0$ of a CPWG is a function of the width W of the central signal line (e.g., $W_0$, $W_1$ in FIG. 16) and the gap spacing distance D (e.g., $D_{0a}$, $D_{0b}$, $D_{1a}$, $D_{1b}$ in FIG. 16) between the central signal line 1604 and its flanking return conductive traces 1606, 1608. To make a higher impedance transmission line, the width W of the central signal line is reduced and/or the gap spacing distance D is increased. Each CPWG channel of a multi-channel DSA should be configured to have a higher characteristic impedance than the characteristic impedance of a single CPWG channel so that the total parallel characteristic impedance of the multi-channel DSA is essentially the same as the characteristic impedance of the single CPWG channel. For example, TABLE 5 below shows examples of transmission line dimensions for a single channel CPWG having a characteristic impedance of 50 ohms versus a dual-channel CPWG having a characteristic impedance of 100 ohms per channel, and thus an overall characteristic impedance of 50 ohms (the example assumes that all CPWGs are fabricated on the same type of substrate). Of note, because of the shared grounded return conductive trace 1608, the total width $W_T$ of both CPWGs in the dual channel configuration is less than twice the total width $W_T$ of a single channel CPWG, thus consuming less integrated circuit area than would be consumed by two separate signal channel CPWGs.

TABLE 5

| Parameter | 50 Ohms per Channel (Single Channel) | 100 Ohms per channel (Dual Channels) | Units |
|---|---|---|---|
| Central Line Width W | 94 | 10 | μm |
| Gap Spacing Distance D | 70 | 88 | μm |
| Ground return width | 50 | 50 | μm |
| Total Width $W_T$ of CPWGs | 334 | 552 | μm |

The design parameters that affect the characteristic impedance of a CPWG channel need not be the same for all channels. For example, the width W of the central signal line and/or the gap spacing distance D of Channel 0 need not be the same as for Channel 1 in the example of FIG. 16.

In addition to the design parameters that affect the characteristic impedance of each CPWG channel, the other design parameters and configuration variables described above also apply. Thus, for example, the number of attenuator cells 1602 per channel may be varied, and need not be the same number in each channel. As another example, one or more channels may comprise a CPWG, while one or more other channels may be non-CPWG embodiments, such as a microstrip-based attenuator channel, or a channel comprising resistor-based attenuator cells such as those described above. As yet another example, the type of attenuator cell used in each channel or within a channel may vary among the bit positions. Further, because of inherent parasitic capacitance in a CPWG channel, simple distributed switched shunt resistive elements may be used for some or all of the attenuator cells 1602.

Embodiments of multi-channel DSA that utilize multiple CPWG channels retain the fundamental benefits of non-CPWG embodiments, including mitigating attenuation glitches by 1/N (where N is the number of channels of attenuator cells) and increasing mid-range resolution (i.e., decreasing step size) of such DSAs. In addition, the distributed nature of a transmission line such as a CPWG allows optimizing inductive and capacitive components (including parasitic inductive and/or capacitive elements) of the attenuator cells 1602 to match or offset device parameters of other elements (such as the off capacitance, $C_{OFF}$, of FET switch devices included within or influencing such attenuator cells 1602) for impedance matching purposes and/or to adjust the bandwidth of the DSA.

Methods

Another aspect of the invention includes a method for implementing a multi-channel digital step attenuator, including providing an array of N channels of B selectable attenuator cells series-connected between an input port and an output port, where N is an integer greater than one and n is a channel number within the N channels, and B is an integer equal to or greater than one and b is a bit position within the B selectable attenuator cells.

Other embodiments of such method may include one or more of the following: wherein each attenuator cell has at least two selectable states, the selectable states comprising at least one attenuation state providing a corresponding specified level of attenuation of a signal applied at the input port, and a bypass state providing essentially no significant attenuation of the applied signal; wherein the applied signal is a radio frequency signal; wherein at least one selectable attenuator cell is one of a Bridged-Tee, Pi, Tee, or L-pad type selectable attenuator cell; wherein at least one selectable attenuator cell is a multi-state attenuator cell; wherein at least one channel within the N channels includes at least one branch of selectable attenuator cells; further including forming at least one interconnection between at least two channels within the N channels; wherein at least one interconnection is between adjacent attenuator cells within the at least two channels; wherein at least one interconnection is between offset attenuator cells within the at least two channels; wherein the selectable attenuator cells within at least a first channel include one or more L-pad type selectable attenuator cells of a first orientation, and the selectable attenuator cells within at least a second channel include one or more L-pad type selectable attenuator cells of a second orientation; further including adding an amount of skew impedance to one or more of the L-pad type selectable attenuator cells having the first or the second orientation to achieve approximately matching channel impedances; further including forming and connecting one or more selectively actuatable cross-channel resistors in a matrix of cross-connected selectable attenuator cells between at least one selected pair of channels; wherein each channel of selectable attenuator cells has a selected bit weighting; wherein at least one channel has a selected bit weighting of a first type, and at least one other channel has a selected bit weighting of a second type; wherein the number of selectable attenuator cells in at least one channel differs from the number of selectable attenuator cells in at least one other channel; wherein each channel of selectable attenuator cells has a corresponding maximum attenuation, and the corresponding maximum attenuation of at least one channel differs from the corresponding maximum attenuation of at least one other channel; wherein each channel of selectable attenuator cells has a corresponding characteristic impedance, and the corresponding characteristic impedance of at least one channel differs from the corresponding characteristic impedance of at least one other channel; and wherein at least one channel includes a coplanar waveguide.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly above about 10 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A multi-channel digital step attenuator comprising a two-dimensional array of N channels of B selectable attenuator cells series-connected between an input port and an output port, where N is an integer greater than one and n is a channel number within the N channels, and B is an integer greater than one and b is a bit position within the B selectable attenuator cells, wherein more than one channel of B selectable attenuator cells can be active at one time.

2. The invention of claim 1, wherein each attenuator cell has at least two selectable states, the selectable states comprising at least one attenuation state providing a corresponding specified level of attenuation of a signal applied at the input port, and a bypass state providing essentially no significant attenuation of the applied signal.

3. The invention of claim 2, wherein the applied signal is a radio frequency signal.

4. The invention of claim 1, wherein at least one selectable attenuator cell is one of a Bridged-Tee, Pi, Tee, or L-pad type selectable attenuator cell.

5. The invention of claim 1, wherein at least one selectable attenuator cell is a multi-state attenuator cell.

6. The invention of claim 1, wherein at least one channel within the N channels includes at least one branch of selectable attenuator cells.

7. The invention of claim 1, further including at least one interconnection between at least two channels within the N channels.

8. The invention of claim 7, wherein at least one interconnection is between adjacent attenuator cells within the at least two channels.

9. The invention of claim 7, wherein at least one interconnection is between offset attenuator cells within the at least two channels.

10. The invention of claim 1, wherein the selectable attenuator cells within at least a first channel include one or more L-pad type selectable attenuator cells of a first orientation, and the selectable attenuator cells within at least a second channel include one or more L-pad type selectable attenuator cells of a second orientation.

11. The invention of claim 10, wherein an additional amount of skew impedance is added to one or more of the L-pad type selectable attenuator cells having the first or the second orientation to achieve approximately matching channel impedances.

12. The invention of claim 1, further including one or more cross-channel resistors selectively actuatable so as to form a matrix of cross-connected selectable attenuator cells between at least one selected pair of channels.

13. The invention of claim 1, wherein each channel of selectable attenuator cells has a selected bit weighting.

14. The invention of claim 13, wherein at least one channel has a selected bit weighting of a first type, and at least one other channel has a selected bit weighting of a second type.

15. The invention of claim 1, wherein the number of selectable attenuator cells in at least one channel differs from the number of selectable attenuator cells in at least one other channel.

16. The invention of claim 1, wherein each channel of selectable attenuator cells has a corresponding maximum attenuation, and the corresponding maximum attenuation of at least one channel differs from the corresponding maximum attenuation of at least one other channel.

17. The invention of claim 1, wherein each channel of selectable attenuator cells has a corresponding characteristic impedance, and the corresponding characteristic impedance of at least one channel differs from the corresponding characteristic impedance of at least one other channel.

18. The invention of claim 1, wherein at least one channel includes a coplanar waveguide.

19. A method for implementing a multi-channel digital step attenuator including providing a two-dimensional array of N channels of B selectable attenuator cells series-connected between an input port and an output port, where N is an integer greater than one and n is a channel number within the N channels, and B is an integer greater than one and b is a bit position within the B selectable attenuator cells, wherein more than one channel of B selectable attenuator cells can be active at one time.

20. The method of claim 19, wherein each attenuator cell has at least two selectable states, the selectable states comprising at least one attenuation state providing a corresponding specified level of attenuation of a signal applied at the input port, and a bypass state providing essentially no significant attenuation of the applied signal.

21. The method of claim 20, wherein the applied signal is a radio frequency signal.

22. The method of claim 19, wherein at least one selectable attenuator cell is one of a Bridged-Tee, Pi, Tee, or L-pad type selectable attenuator cell.

23. The method of claim 19, wherein at least one selectable attenuator cell is a multi-state attenuator cell.

24. The method of claim 19, wherein at least one channel within the N channels includes at least one branch of selectable attenuator cells.

25. The method of claim 19, further including forming at least one interconnection between at least two channels within the N channels.

26. The method of claim 25, wherein at least one interconnection is between adjacent attenuator cells within the at least two channels.

27. The method of claim 25, wherein at least one interconnection is between offset attenuator cells within the at least two channels.

28. The method of claim 19, wherein the selectable attenuator cells within at least a first channel include one or more L-pad type selectable attenuator cells of a first orientation, and the selectable attenuator cells within at least a second channel include one or more L-pad type selectable attenuator cells of a second orientation.

29. The method of claim 28, further including adding an amount of skew impedance to one or more of the L-pad type selectable attenuator cells having the first or the second orientation to achieve approximately matching channel impedances.

30. The method of claim 19, further including forming and connecting one or more selectively actuatable cross-channel resistors in a matrix of cross-connected selectable attenuator cells between at least one selected pair of channels.

31. The method of claim 19, wherein each channel of selectable attenuator cells has a selected bit weighting.

32. The method of claim 31, wherein at least one channel has a selected bit weighting of a first type, and at least one other channel has a selected bit weighting of a second type.

33. The method of claim 19, wherein the number of selectable attenuator cells in at least one channel differs from the number of selectable attenuator cells in at least one other channel.

34. The method of claim 19, wherein each channel of selectable attenuator cells has a corresponding maximum attenuation, and the corresponding maximum attenuation of at least one channel differs from the corresponding maximum attenuation of at least one other channel.

35. The method of claim 19, wherein each channel of selectable attenuator cells has a corresponding characteristic impedance, and the corresponding characteristic impedance of at least one channel differs from the corresponding characteristic impedance of at least one other channel.

36. The method of claim 19, wherein at least one channel includes a coplanar waveguide.

37. The invention of any one of claims 1 through 36:
   (a) wherein each attenuator cell has at least two selectable states, the selectable states comprising at least one attenuation state providing a corresponding specified level of attenuation of a signal applied at the input port, and a bypass state providing essentially no significant attenuation of the applied signal;
   (b) wherein the applied signal is a radio frequency signal;
   (c) wherein at least one selectable attenuator cell is one of a Bridged-Tee, Pi, Tee, or L-pad type selectable attenuator cell;
   (d) wherein at least one selectable attenuator cell is a multi-state attenuator cell;
   (e) wherein at least one channel within the N channels includes at least one branch of selectable attenuator cells;
   (f) further including at least one interconnection between at least two channels within the N channels;
   (g) wherein at least one interconnection is between adjacent attenuator cells within the at least two channels;
   (h) wherein at least one interconnection is between offset attenuator cells within the at least two channels;
   (i) wherein the selectable attenuator cells within at least a first channel include one or more L-pad type selectable attenuator cells of a first orientation, and the selectable attenuator cells within at least a second channel include one or more L-pad type selectable attenuator cells of a second orientation;
   (j) wherein an additional amount of skew impedance is added to one or more of the L-pad type selectable attenuator cells having the first or the second orientation to achieve approximately matching channel impedances;
   (k) further including one or more cross-channel resistors selectively actuatable so as to form a matrix of cross-connected selectable attenuator cells between at least one selected pair of channels;
   (l) wherein each channel of selectable attenuator cells has a selected bit weighting;
   (m) wherein at least one channel has a selected bit weighting of a first type, and at least one other channel has a selected bit weighting of a second type;
   (n) wherein the number of selectable attenuator cells in at least one channel differs from the number of selectable attenuator cells in at least one other channel;
   (o) wherein each channel of selectable attenuator cells has a corresponding maximum attenuation, and the corresponding maximum attenuation of at least one channel differs from the corresponding maximum attenuation of at least one other channel;
   (p) wherein each channel of selectable attenuator cells has a corresponding characteristic impedance, and the corresponding characteristic impedance of at least one channel differs from the corresponding characteristic impedance of at least one other channel;
   (q) further including forming at least one interconnection between at least two channels within the N channels;
   (r) further including adding an amount of skew impedance to one or more of the L-pad type selectable attenuator cells having the first or the second orientation to achieve approximately matching channel impedances;
   (s) further including forming and connecting one or more selectively actuatable cross-channel resistors in a matrix of cross-connected selectable attenuator cells between at least one selected pair of channels; and/or
   (t) wherein at least one channel includes a coplanar waveguide.

\* \* \* \* \*